(12) United States Patent
Minamitani et al.

(10) Patent No.: US 6,264,704 B1
(45) Date of Patent: Jul. 24, 2001

(54) METHOD AND APPARATUS FOR MOUNTING COMPONENT

(75) Inventors: Shozo Minamitani, Hirakata; Takashi Shimizu, Kishiwada; Shinji Kanayama, Kashihara; Kenji Takahashi, Suita; Kazushi Higashi, Neyagawa; Satoshi Shida, Hirakata; Naoto Hosotani, Osaka, all of (JP)

(73) Assignee: Matsushita Electric Industrial Co., Ltd., Kadoma (JP)

( * ) Notice: Subject to any disclaimer, the term of this patent is extended or adjusted under 35 U.S.C. 154(b) by 0 days.

(21) Appl. No.: 09/266,928

(22) Filed: Mar. 12, 1999

(30) Foreign Application Priority Data

Mar. 13, 1998 (JP) .................................................. 10-062864

(51) Int. Cl.⁷ ............................. H01L 21/00; H01L 21/64
(52) U.S. Cl. ............................................................. 29/25.01
(58) Field of Search ............................................. 29/25.01

(56) References Cited

U.S. PATENT DOCUMENTS

| | | | |
|---|---|---|---|
| 4,731,923 | * | 3/1988 | Yagi et al. . |
| 5,628,111 | * | 5/1997 | Iwasaki et al. . |
| 5,667,129 | * | 9/1997 | Morita et al. . |
| 5,839,187 | * | 11/1998 | Sato et al. . |
| 5,894,657 | * | 4/1999 | Kanayama et al. . |

* cited by examiner

Primary Examiner—David E Graybill
(74) Attorney, Agent, or Firm—Wenderoth, Lind & Ponack, L.L.P.

(57) ABSTRACT

A divided component separated individually beforehand is supplied in a state while stored in a storage body, taken outside by a take-out and storage unit, and a component is mounted on the divided component by a mounting unit, and thereby a divided component with the component is produced. A plurality of the produced divided components with the components mounted thereon are collected into the storage body.

14 Claims, 16 Drawing Sheets

METHOD AND APPARATUS FOR MOUNTING COMPONENT

BACKGROUND OF THE INVENTION

1. Field of the Invention

The present invention relates to a method for supplying a divided component which is separated previously into individual parts and is stored in a storage body and bringing a divided component after being processed back into the storage body, and an apparatus for executing the method. The divided component is, e.g., individual semiconductor substrate cut from a semiconductor wafer.

2. Description of the Related Art

A circuit board with a plurality of the same circuit sections 24 formed therein, that is, a bulk circuit board 23 is sent to an electronic component mounting apparatus to secure high productivity, as shown in FIG. 18. Every one or every plurality of electronic components 21 held by an electronic component mounting nozzle 20 are mounted to the circuit sections 24 of the circuit board 23 by the nozzle 20. A circuit board with the electronic components mounted is carried out when the electronic components 21 are mounted to all circuit sections 24 of the circuit board 23. The component mounted circuit board is separated into individual circuit parts 26 with the electronic components and then the separated circuit parts 26 are supplied to a next process.

In the case where the electronic components 21 are mounted to the circuit sections 24 by flip-chip mounting, more specifically, electrodes 28 on each circuit section 24 are connected to electrodes 25 of the corresponding electronic component 21 via bumps 22 as shown in FIG. 19, and then the circuit board 23 is separated into individual circuit parts 26 by a cracking along scribe lines. In this case, since the circuit sections 24 are warped, a stress acts on each connected part between the electrodes 28 on the circuit section 24 and the electrodes 25 on the electronic component 21. Thus the connected part may be disconnected by the stress, that is, the stress may cause a junction failure. For solving the problem, the circuit board 23 is separated beforehand into the individual circuit sections 24 and the divided circuit sections 24 are supplied to the electronic component mounting apparatus for mounting of the electronic components 21 thereto, and then individual circuit parts 26 mounting the electric components 21 thereon are transferred to the next process as mentioned above.

However, an effective means for supplying each divided circuit section 24 to the electronic component mounting apparatus and transferring the finished circuit parts 26 to the next process has not yet been devised.

SUMMARY OF THE INVENTION

The present invention accordingly provides a method for mounting components and an apparatus for executing the method whereby each divided component can be supplied in a manner that will not give rise to a junction failure at a junction part where the divided component and a component mounted on the divided component are connected. Also, a divided component with the component mounted on the divided component can be transferred, so that the divided component with the component mounted thereto is improved in quality.

According to a first aspect of the present invention, there is provided a method for mounting component which comprises:

taking out a divided component separated from a collective part from a storage body;

mounting a component to the taken divided component; and storing a divided component with the component mounted thereto into the storage body again.

According to a second aspect of the present invention, there is provided an apparatus for mounting component, which comprises:

a storage body for storing a divided component separated from a collective part;

a take-out and storage unit which takes out the divided component from the storage body, brings back the divided component with component mounted thereto into the storage body, further transfers the divided component from the storage body to a component mount stage where the component is mounted to the divided component and transfers the divided component with the component mounted thereto from the component mount stage to the storage body;

a mounting unit which mounts the component to the divided component taken out by the take-out and storage unit thereby forming the divided component with the component mounted thereto; and a control unit which controls operations of the take-out and storage unit and the mounting unit.

According to the component mount method in the first aspect of the present invention and the component mounting apparatus in the second aspect of the present invention, there are provided the take-out and storage unit and the mounting unit, whereby the component is mounted to the divided component taken out from the storage body and then the divided component with the component mounted thereto is collected into the storage body again. Accordingly, regarding any component such that a problem is occurred when a collective part mounting components thereto is separated to a respective divided component with the component mounted thereto as the conventional art, in the present invention, the divided component separated previously from the collective part can be supplied by the storage body storing the divided component, and the component can be mounted to the individual divided component. Therefore, each divided component with the component mounted thereto is improved in quality without the inconvenience experienced in the prior art. Moreover, the divided components with the components can be collected again into the storage body, so that each divided component can be handled with ease.

BRIEF DESCRIPTION OF THE DRAWINGS

These and other objects and features of the present invention will become clear from the following description taken in conjunction with the preferred embodiment thereof with reference to the accompanying drawings in which.

DETAILED DESCRIPTION OF THE PREFERRED EMBODIMENT

Figure 1:
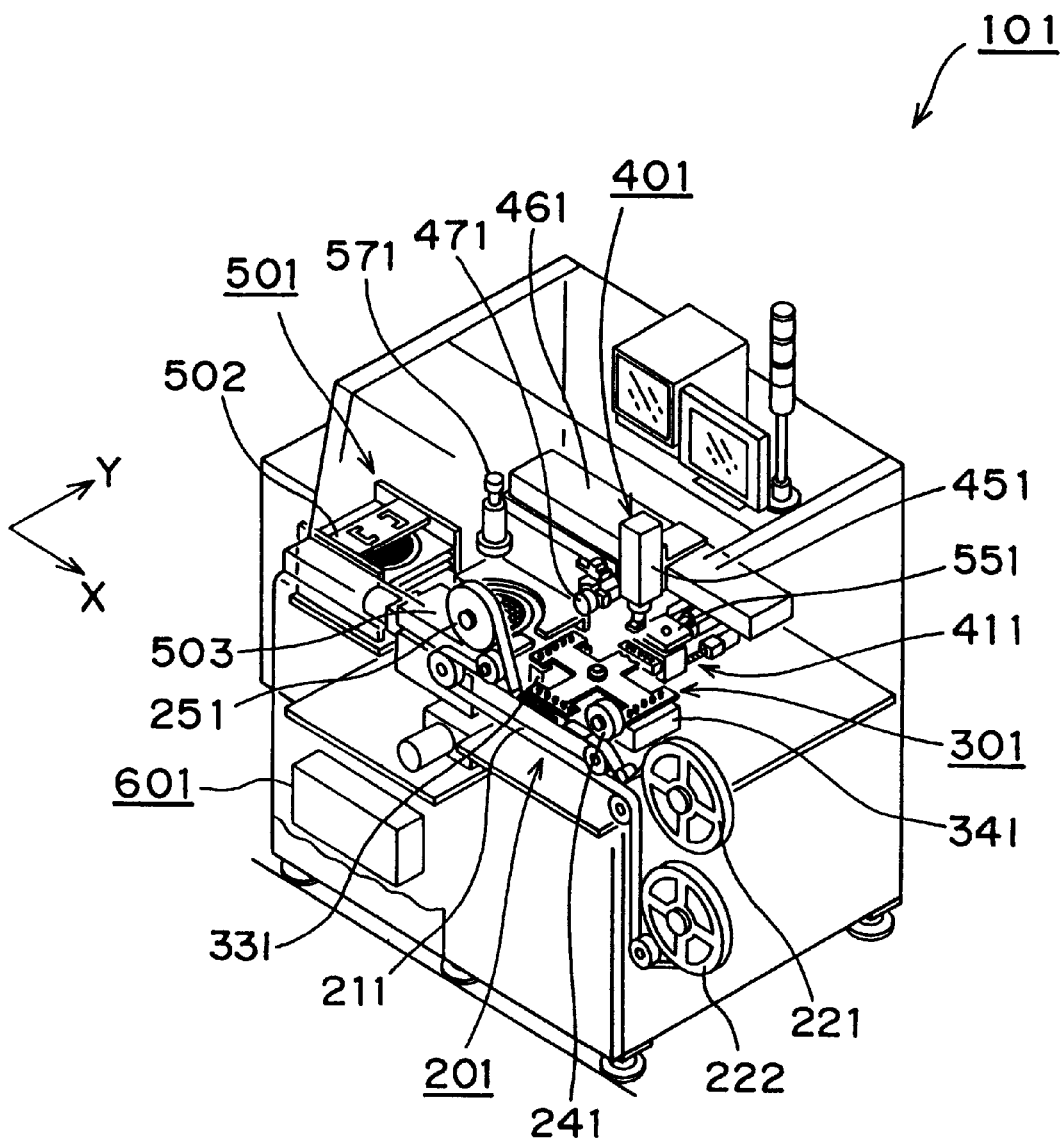
FIG. 1 is a perspective view of a component mounting apparatus embodied by the present invention.

A method for mounting components, and an apparatus for executing the method embodied by the present invention will be described with reference to the drawings throughout which like parts are designated by like reference numerals. An example functioning as the "divided component" in the above SUMMARY OF THE INVENTION corresponds to a "framed substrate 53" and an example functioning as the "divided component having the component mounted thereto" corresponds to a "SAW filter 50" in the description below of the embodiment.

Figure 5:
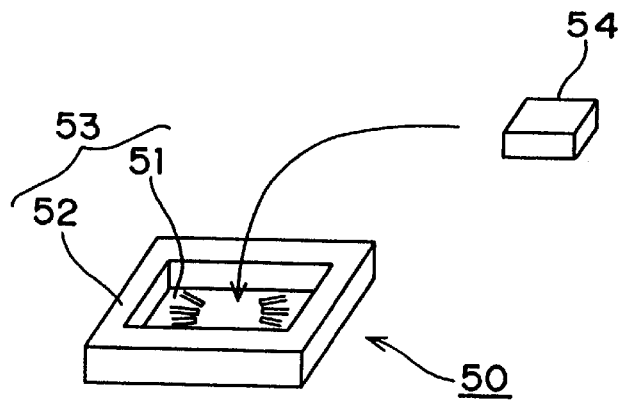
FIG. 5 is a perspective view of a framed substrate and an oscillating element handled by the component mounting apparatus of FIG. 1.

Components handled in the method and apparatus of the present invention are electronic components, particularly, oscillation electronic components such as SAW (Surface Acoustic Wave) filters, quartz oscillators, etc as an example. For instance, as shown in FIG. 5, the SAW filter has a frame body 52 on a substrate 51 on which a wiring pattern is formed. The SAW filter has a construction including an oscillating element 54 that is flip-chip mounted via the wiring pattern and bumps onto a storage section surrounded by the frame body 52, and a lid is then capped to the frame body 52, thereby sealing the oscillating element 54. Generally, an adhesive is applied between the substrate and a chip or the chip is sealed so as to increase a junction strength between the substrate and chip at the flip-chip mounting of the electronic component. However, in the case of the SAW filter 50 utilizing the oscillation of the oscillating element 54 for the operation, the adhesive or sealant restricts the oscillation of the oscillating element 54 and therefore the substrate 51 and the oscillating element 54 are connected solely via, e.g., a gold bump, without using the adhesive or sealant. So, as described above, after a plurality of SAW filters are formed on one substrate previously and the substrate is cracked and separated into individual SAW filters, the warp of the substrate that occurs due to the cracking and separation may invite a break in the part connected via the bump, which then results in an electric connection failure. It is accordingly preferable for the SAW filter 50 that the substrate 51 with the frame body 52 (referred to as a "framed substrate 53" hereinafter), which is separated previously, is supplied individually as the divided component and the oscillating element 54 is flip-chip mounted to the individual framed substrate 53. The SAW filter 50 in the embodiment is 2 mm×3 mm and the oscillating element 54 is 0.5 mm×0.5 mm.

Although the framed substrate 53 is exemplified as the divided component in the method and apparatus of the embodiment of the present invention, the divided component is not limited to the framed substrate 53 and corresponds to any component that after it is finished as a collective part, the collective part cannot be separated conveniently.

The apparatus for mounting components will be described first. A component mounting apparatus 101 of the embodiment shown in FIG. 1 roughly comprises a feed collection unit 201, a take-out and storage unit 301, a mounting unit 401, a component feed unit 501, a vertical visual field optical device 551, a component image pickup device 571 and a control unit 601.

Figure 2:
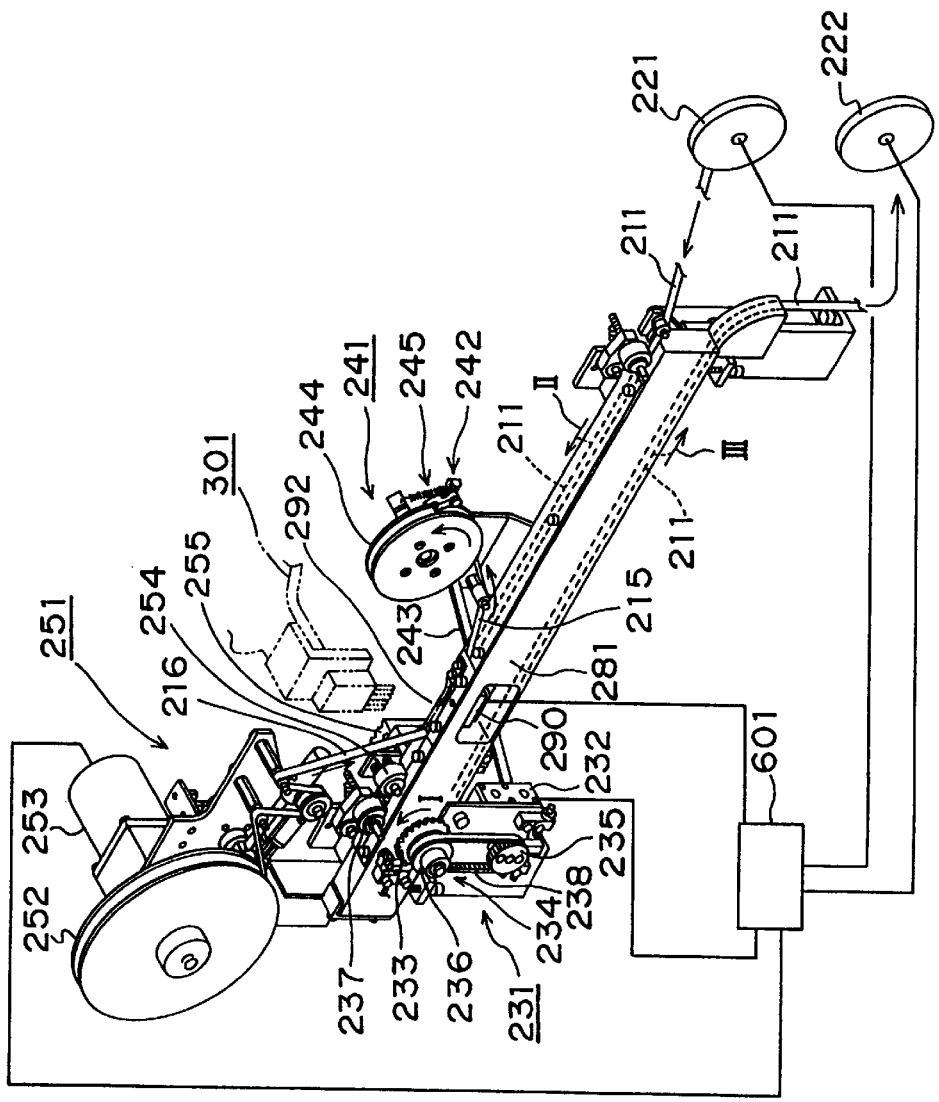
FIG. 2 is a perspective view of a feed collection unit of FIG. 1.

The feed collection unit 201 constructed as indicated in FIG. 2 supplies the framed substrates 53 to the take-out and the storage unit 301 and also receives, that is, collects the SAW filters 50 from the take-out and storage unit 301. The feed collection unit 201 includes a storage body 211 storing the framed substrates 53 and SAW filters 50, a feed reel 221 to which the storage body 211 storing the framed substrates 53 is wound, a collection reel 222 to which the storage body 211 storing the SAW filters 50 is wound, a transfer device 231 for transferring the storage body 211 from the feed reel 221 to the collection reel 222, a protecting member removable device 241 for removing a first protecting member 215 fitted beforehand to the storage body 211 and a protecting member set device 251 for setting a second protecting member 216 to the storage body 211.

The storage body 211 is formed of a resin material in a flexible tape as shown in FIG. 1. Concave storage sections 212 are formed in the storage body via a constant distance in an extension direction for storing the framed substrates 53 as the divided components and the SAW filters 50, as is clear from FIG. 6. The storage body 211 in the embodiment is formed of the resin material that is light transmissible so that the presence/absence of the framed substrate 53 in the storage section 212 can be detected from the presence/absence of light from a light-emitting diode (LED) 291. Moreover, the storage body 211 has an opening 214 penetrating a bottom plate 212a of each storage section 212 to enable the light generated from the LED 291 arranged opposite to the bottom plate 212a, to reach the framed substrate 53 through the bottom plate 212a. The LED 291 is installed at a light-emitting detecting device 290 and is disposed, as will be described later, at a take-out storage position 292 where the framed substrates 53 are taken out and the SAW filters 50 are stored. The light-emitting detecting device 290 detects the presence/absence of the framed substrates 53 and SAW filters 50 in the storage sections 212 and sends detected information to the control unit 601. In the present embodiment, the take-out and storage unit 301 to be described later takes out five framed substrates 53 at one time at the take-out storage position 292, and therefore five LEDs 291 are arranged to face the corresponding storage sections 212 at the take-out storage position 292.

Figure 6:
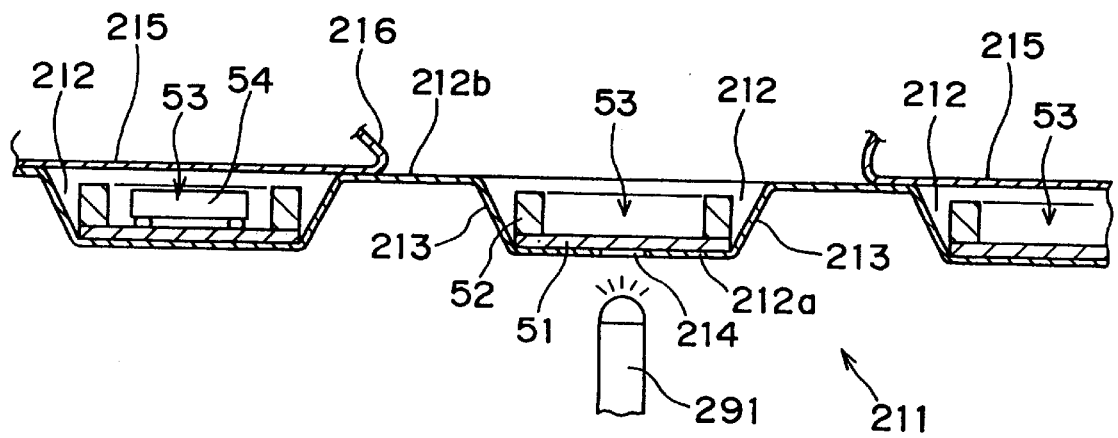
FIG. 6 is a sectional view of a storage body used in the feed collection unit of FIG. 1.

An area at the entrance side of the storage section 212 is made larger than an area of the bottom plate 212a to facilitate storage of the framed substrate 53 and SAW filter 50. More specifically, a taper 213 is formed at the storage section 212 as indicated in FIG. 6. Furthermore, the area of the bottom plate 212a is made equal to an area of a base of the framed substrate 53 in order to prevent the framed substrate 53 and SAW filter 50 from rattling in the storage section 212.

The first protecting member 215 and second protecting member 216 are attached adhesively to an upper face 212b of the storage body 211 to prevent the framed substrates 53 and SAW filters 50 from dropping out of the storage sections 212 and prevent dust, etc. The first protecting member 215 is peeled-off from the upper face 212b of the storage body 211 immediately before the framed substrates 53 are taken out from the storage sections 212 at the take-out storage position 292. The second protecting member 216 is attached adhesively to the upper face 212b immediately after the SAW filters 50 are accommodated in the storage sections 212 at the take-out storage position 292.

The feed reel 221 and the collection reel 222 respectively feed and wind the storage body 211 in synchronization with the transfer of the storage body 211 by the transfer device 231 under the control of the control unit 601. A tensioner is set to each of the feed reel 221 and collection reel 222 to prevent the tape-like storage body 211 from slackening.

Figure 3:
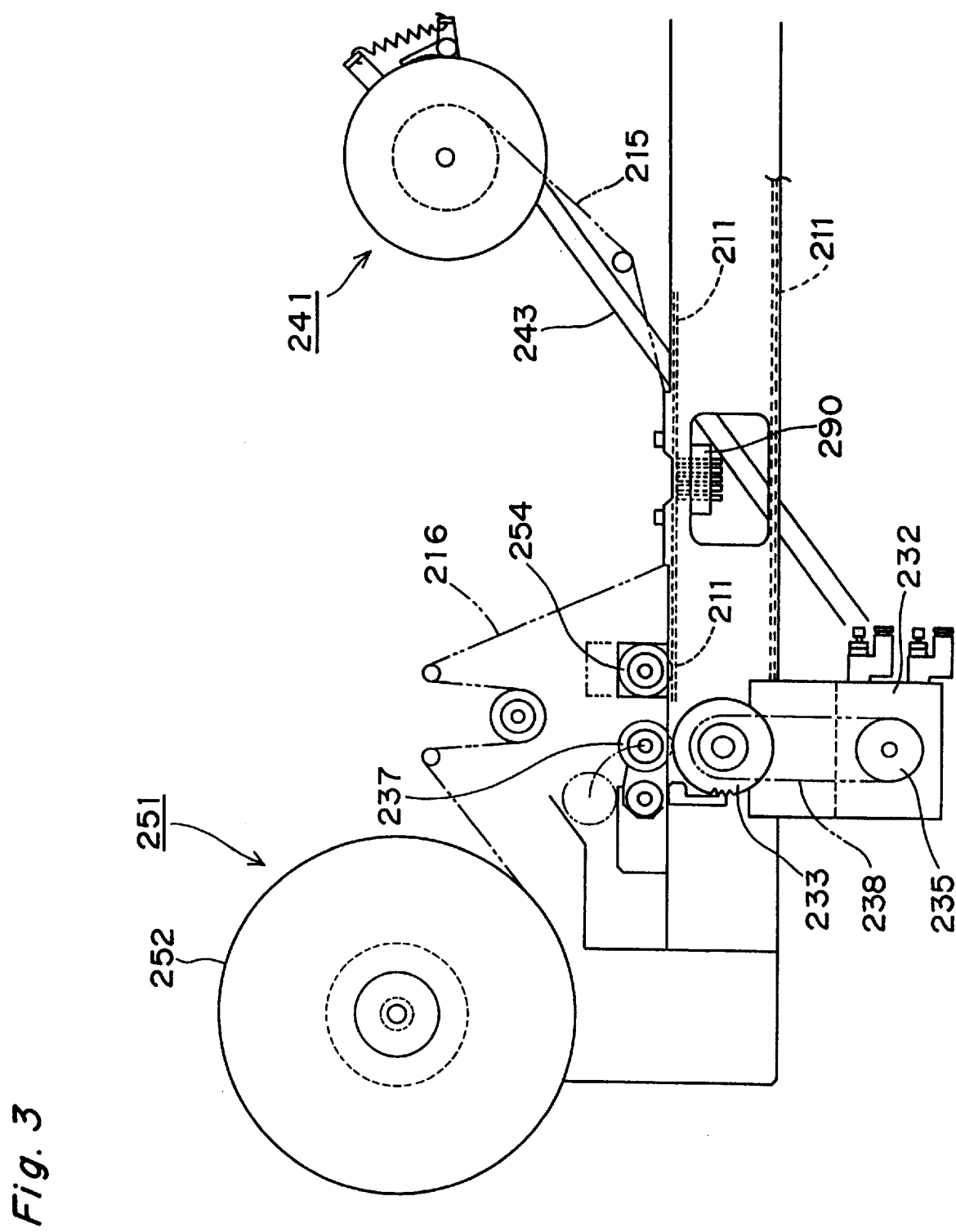
FIG. 3 is a side view showing in detail a transfer unit, a protecting member removal device and a protecting member set device in the feed collection unit of FIG. 2.
Figure 4:
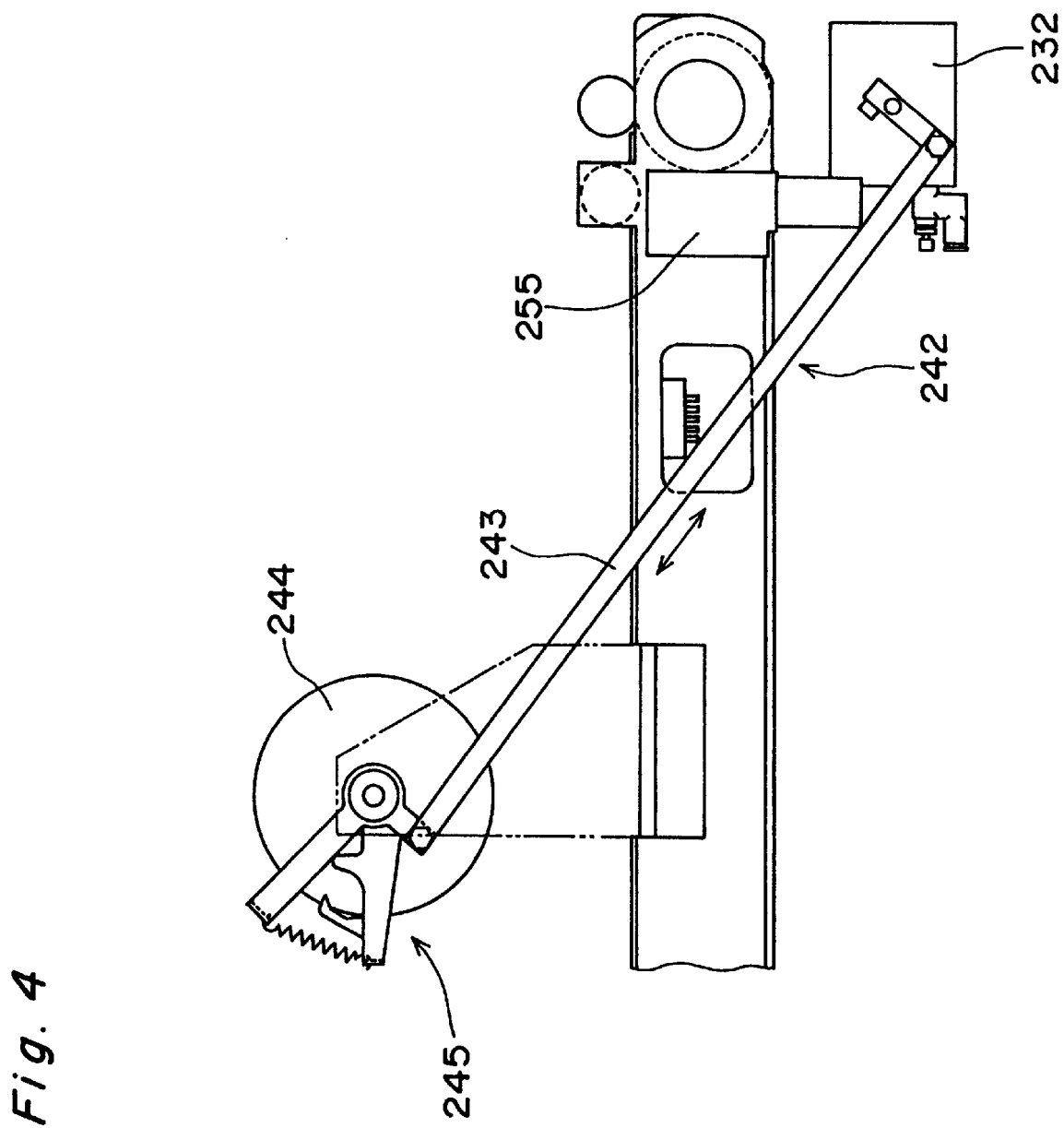
FIG. 4 is a side view showing in detail the protecting member removal device in the feed collection unit of FIG. 2.

As shown in FIGS. 2–4, the transfer device 231 has a driving portion 232, a transfer roller 233 and a driving mechanism 234 driven by the driving portion 232 to intermittently rotate the transfer roller 233. The driving portion 232 in the embodiment is an air cylinder reciprocating subsequent to the supply of air, thereby rotating a first roller 235 of the driving mechanism 234 forward and rearward with a constant rotational angle. The forward-rearward rotation of the first roller 235 is transmitted via a belt 238 to a second roller 236, so that the second roller 236 is rotated forward and rearward synchronously with the rotation of the first roller 235. The second roller 236 is a transmission device, having a ratchet wheel, coupled to the transfer roller 233 via a ratchet gearing having a one-way intermittent feed function. The transfer roller 233 is intermittently rotated by every fixed angle in a direction of an arrow I consequent to the forward-rearward rotation of the second roller 236. A press roller 237 presses the storage body 211 to the transfer roller 233, so that the storage body 211 is intermittently transferred in the I direction synchronously with the intermittent rotation of the transfer roller 233. In the illustration of FIG. 2, the numeral "233" indicates only a gear set outside. Actually the transfer roller 233 is disposed so as to face the press roller 237 inside a frame 281 constituting the feed collection unit 201, and is formed integrally with the gear and is a gear wheel engaged with the storage body 211.

The storage body 211 moves from the feed reel 221 along an upper edge of the frame 281 in a direction of an arrow II. Immediately before the storage body 211 reaches the take-out storage position 292, the first protecting member 215 is peeled off by the removal device 241. Immediately after the storage body 211 passes the take-out storage position 292, the second protecting member 216 shuts the storage sections 212 of the storage body 211 by the set device 251. The storage body 211 thereafter is sent via the transfer roller 233 along a lower edge of the frame 281 in a direction of an arrow III and wound on the collection reel 222.

The protecting member removal device 241 peels off the tape-like first protecting member 215, which is of approximately the same breadth as the storage body 211 and is adhered to the upper face 212b of the storage body 211, as discussed earlier. The removal device 241 has a transmission mechanism 242 so that the device is driven by a driving force generated by the driving portion 232 of the above transfer device 231. The removable device 241 further includes a wind reel 244 to wind the removed first protecting member 215. The transmission mechanism 242 has an arm 243 reciprocating interlockingly with the reciprocation generated by the driving portion 232 and, an intermittent rotary mechanism 245 which is set on the wind reel 244 and intermittently rotates the wind reel 244 by every constant angle in a direction of an arrow IV in correspondence to the reciprocation of the arm 243, i.e., in synchronization with the transfer operation for the storage body 211. The first protecting member 215 is accordingly wound to the wind reel 244 synchronously with the intermittent transfer of the storage body 211 by the transfer device 231.

The protecting member set device 251 attaches the tape-like second protecting member 216, which is of approximately the same breadth as the storage body 211, to the upper face 212b of the storage body 211. The set device 251 includes a second protecting member reel 252 for winding the second protecting member 216 and a pressing roller 254 for pressing and adhering the second protecting member 216 to the upper face 212b of the storage body 211. The second protecting member reel 252 sends out the second protecting member 216 by a driving device 253 which is a motor in the embodiment and controlled by the control unit 601. The pressing roller 254 can be moved in a thicknesswise direction of the storage body 211 through driving of a roller movement portion 255 which is an air cylinder in the embodiment, thereby controlling a press force for applying the second protecting member 216 to the storage body 211. The operation of the roller movement portion 255 is controlled by the control unit 601, and therefore the above press force is controlled by the control unit 601. In the construction described above, the second protecting member 216 is sent out from the second protecting member reel 252 in synchronization with the transfer operation for the storage body 211 under the control by the control unit 601, and is pressed and attached to the upper face 212b of the storage body 211 by the pressing roller 254.

Figure 7:
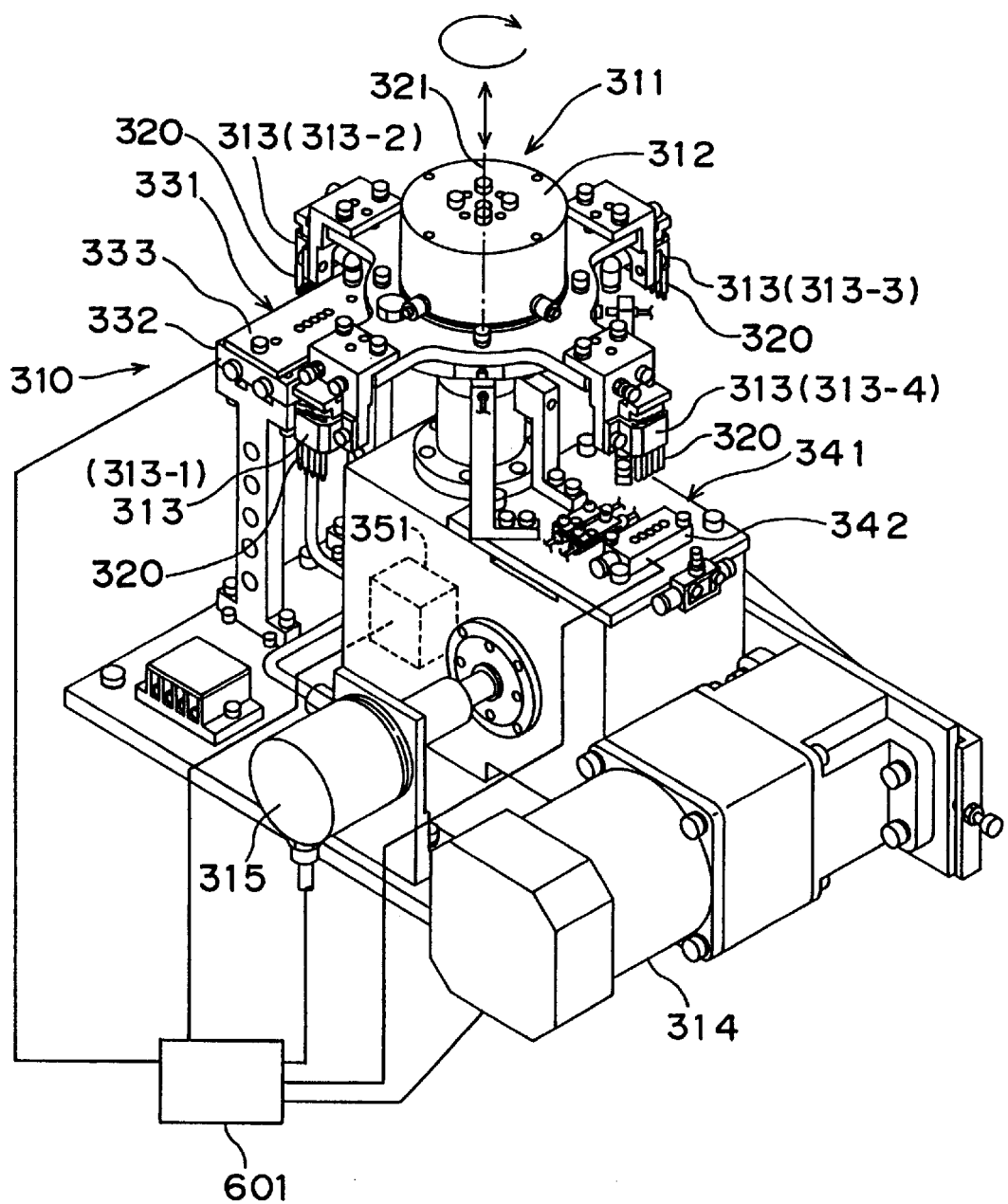
FIG. 7 is a perspective view of a take-out and storage unit of FIG. 1.
Figure 8:
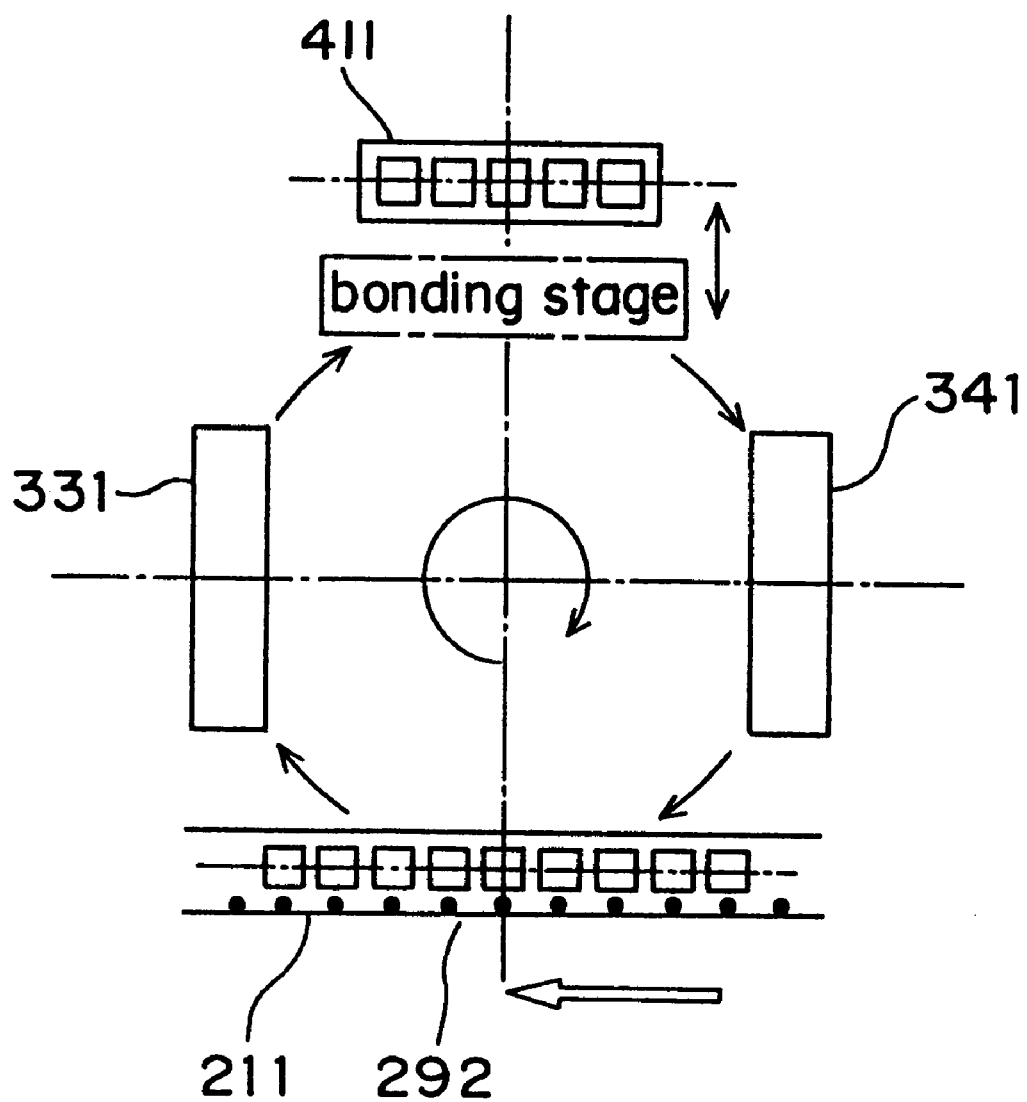
FIG. 8 is a diagram that is explanatory of the operation of the take-out and storage unit of FIG. 7.

The take-out and storage unit 301 will be described. As shown in FIG. 7, the take-out and storage unit 301 comprises a holding transfer device 311, a heating stage 331 and a cooling stage 341. In FIG. 8, the holding transfer device 311 takes out the framed substrates 53 from the storage sections 212 of the storage body 211 transferred to the takeout storage position 292, transfers via the heating stage 331 to a component mount stage 411 of a mounting unit 401 which will be described later, and also transfers the SAW filters 50 from the mount stage 411 via the cooling stage 341 to the take-out storage position 292 to store the SAW filters 50 in the storage sections 212 of the storage body 211.

The holding transfer device 311 has an up-and-down rotary portion 312 and four holding portions 313 arranged at four points spaced at an interval of 90° in a rotational direction of the circumference of the up-and-down rotary portion 312. In the embodiment, the holding portion 313 includes suction nozzles 320 for holding the framed substrates 53 and SAW filters 50 through a suction operation with the use of a suction device 351 of the holding transfer device 311. The holding of the framed substrates 53 and SAW filters 50 by the holding portion 313 is released when the suction operation is freed. The suction device 351 is connected to the control unit 601. Holding portions 313 arranged at the four points are controlled by the control unit 601 to suck and stop sucking the framed substrates 53 and SAW filters 50.

According to the present embodiment, five suction nozzles 320 are aligned in a row in the extension direction of the storage body 211 so that five framed substrates 53 and five SAW filters 50 can be held at one time. The holding portion 313 is not limited to this kind of suction nozzle 320 and the number of nozzles is not limited to five, either.

The up-and-down rotary portion 312 moves up and down along a direction of thickness of the framed substrate 53 and SAW filter between a hold and loading position where the holding portion 313 holds the framed substrates 53 and loads the SAW filters 50, and a transfer position where the framed substrates 53 and SAW filters 50 are transferred in a state while held by the holding portion 313. Moreover, the up-and-down rotary portion 312 rotates about an up-and-down shaft 321 extending in parallel to the thickness direction when up at the transfer position. The up-down movement and rotation of the up-and-down rotary portion 312 is achieved by a motor 314 in the embodiment, and the amount of the movement and rotation is detected by an encoder 315. The motor 314 and encoder 315 are connected to the control unit 601, so that the amount of the above up-down movement and rotation is controlled by the control unit 601.

The heating stage 331 is a device for preliminarily heating the framed substrates 53 so as to reliably mount the oscillating elements 54 to the framed substrates 53 at the component mount stage 411. The heating stage 331 is equipped with a heater 332 for heating a stage plate 333 on which the framed substrates 53 are loaded. In the embodiment, a heating temperature is approximately 250°. The heater 332 is controlled in temperature by the control unit 601. The heating stage 331 sucks to thereby hold the framed substrates 53 on the stage plate 333.

Before the heated SAW filters 50 with the oscillating elements 54 mounted thereon are stored in the storage body 211, the cooling stage 341 is a device for cooling the SAW filters 50 to a temperature that will not damage the storage body 211 by heat. A cooling air is supplied to a stage plate 342 where the SAW filters 50 are loaded, thereby removing the heat of the SAW filters 50, according to the embodiment. A flow rate of the cooling air is controlled by the control unit 601, that is, cooling efficiency is controlled. Cooling by air is not the only method of cooling the SAW filters 50. The SAW filters 50 are held on the stage plate 342 through the suction operation.

The mounting unit 401 will be described with reference to FIGS. 1 and 9. The mounting unit 401 is used to mount the oscillating elements 54 to the framed substrates 53, and includes the component mount stage 411, a stage drive device 440, a component mount head 451, a component mount head-driving device 461 and a component reverse feed head 471. The stage drive device 440 moves the component mount stage 411 in a Y direction that is orthogonal to an X direction on a plane supposing that the earlier-referred II direction of the storage body 211 is the X direction.

Figure 9:
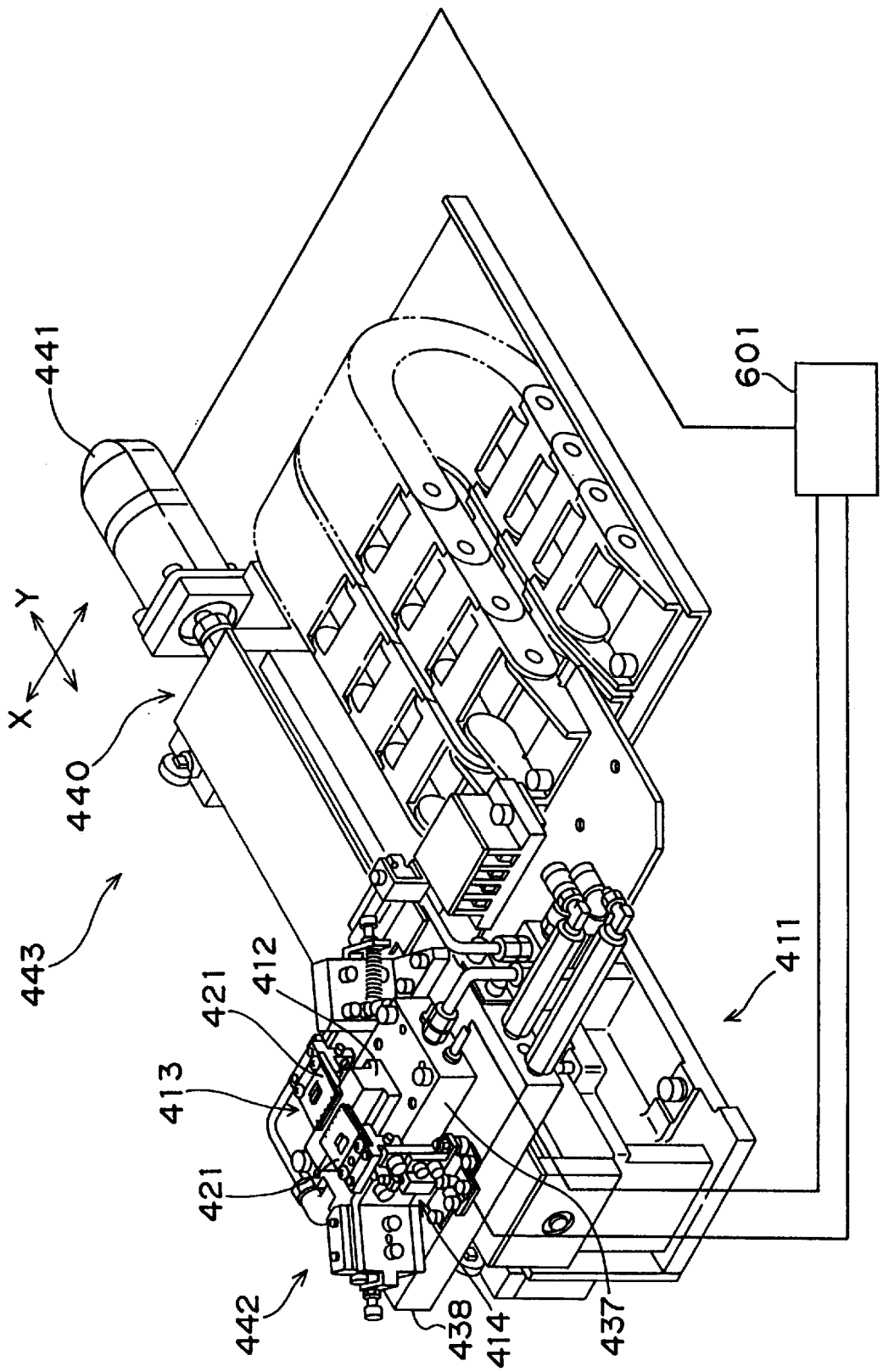
FIG. 9 is a perspective view of a component mount stage of FIG. 1.
Figure 10:
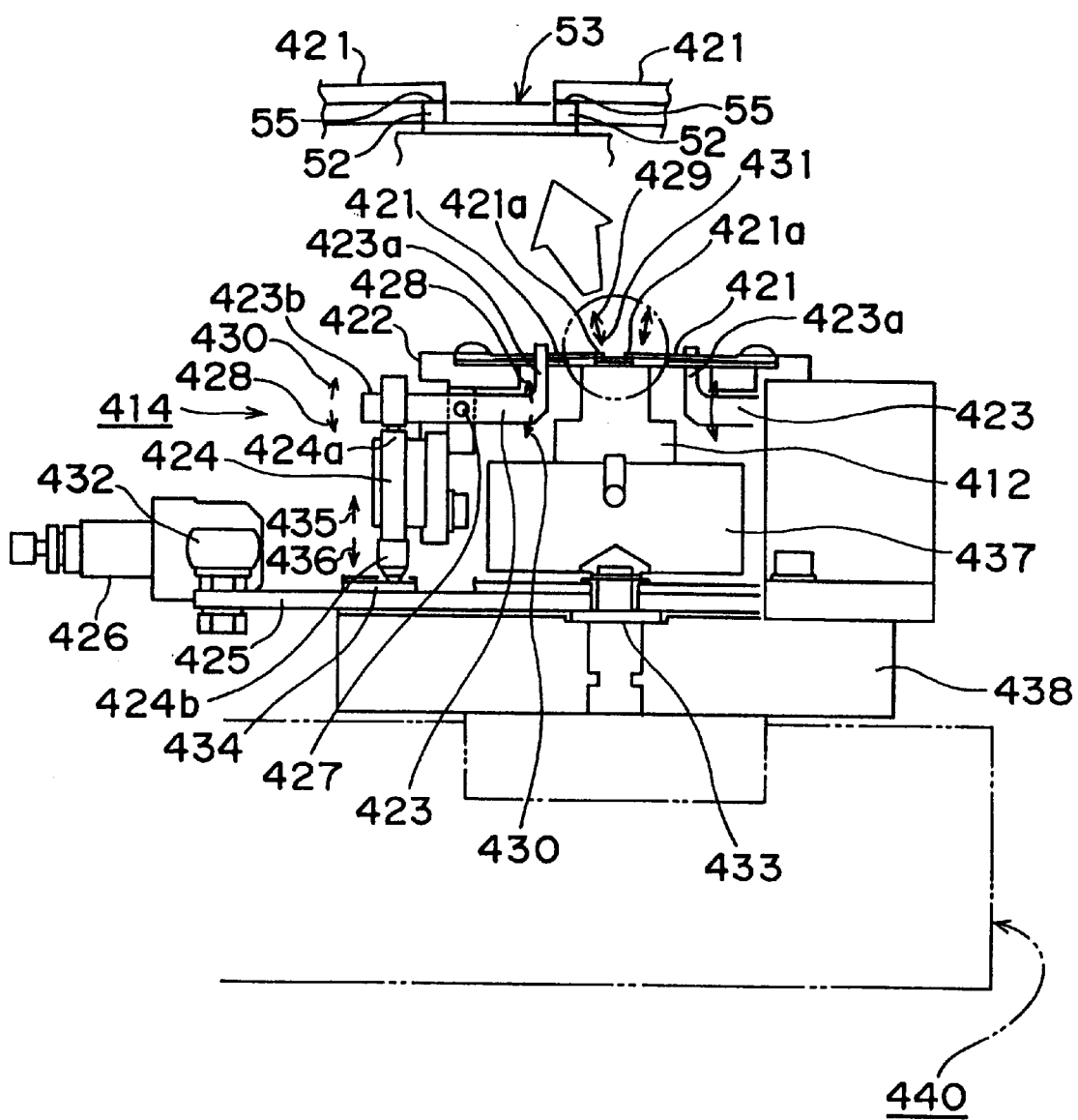
FIG. 10 is a side view of a stage plate of the component mount stage of FIG. 9.

As is clearly shown in FIGS. 9 and 10, according to the embodiment, the component mount stage 411 is provided with a stage plate 412 which holds five framed substrates 53 at one time through the suction operation, and a pressing device 413 which presses confronting peripheral edge parts 55 of the framed substrate 53 thereby fixing the framed substrate 53 to the stage plate 412 when the oscillating element 54 is to be mounted to the framed substrate 53. The stage plate 412 is heated and kept at about 250° C. by a heating device set at a base 437 supporting the stage plate 412. The temperature of the stage plate 412 is detected by a thermocouple disposed at the stage plate 412, and a temperature of the heating device is controlled by the control unit 601.

Figure 11:
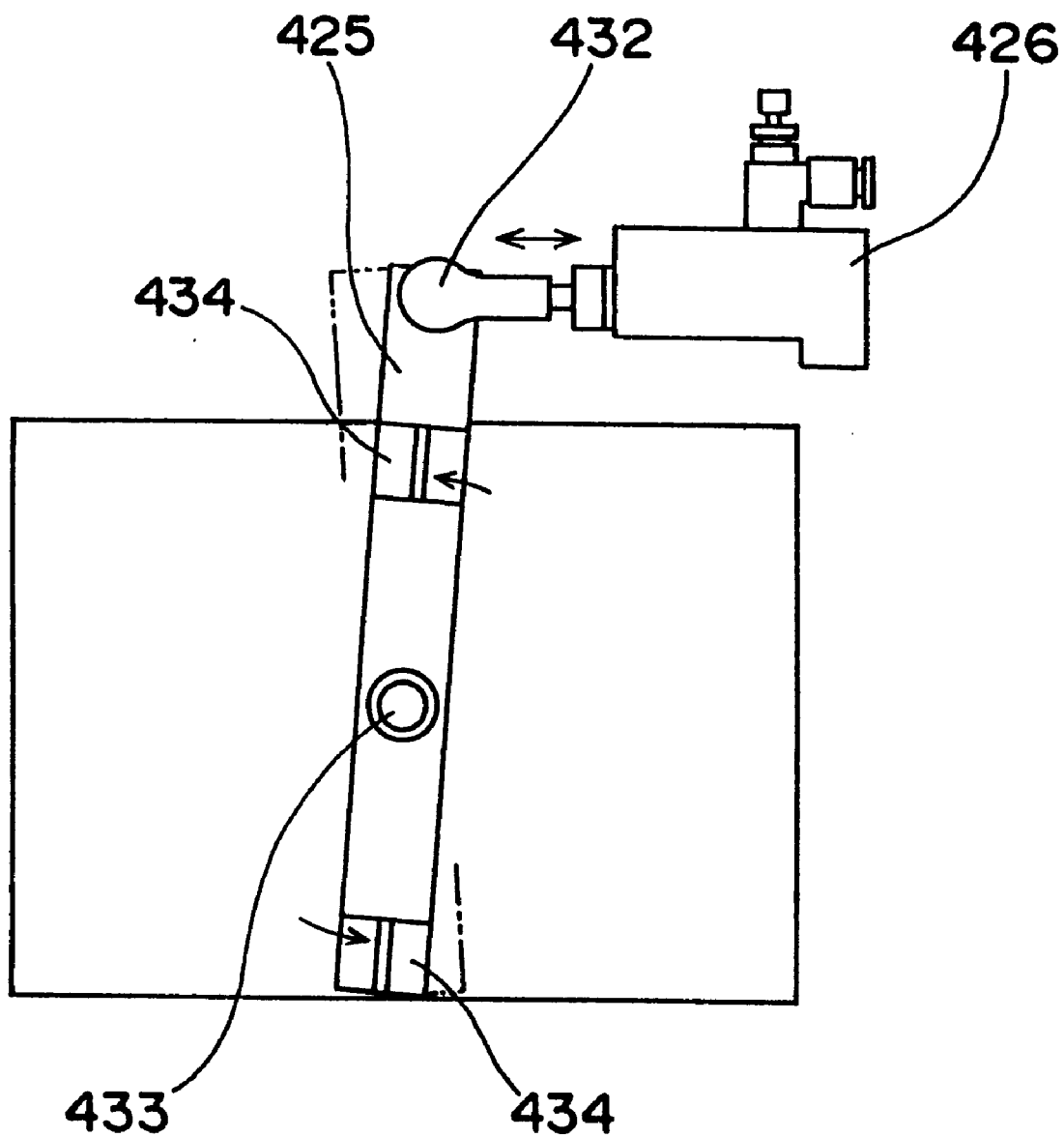
FIG. 11 is a plan view of a driving member and a driving unit of FIG. 10.

The pressing device 413 has a pair of leaf springs 421 and a leaf spring drive mechanism 414. One end of each leaf spring 421 is fixed to a frame member 422 of the component mount stage 411, while each of the other ends 421a is made a free end. Accordingly, the free ends of leaf springs 421 can be in touch with and press the peripheral edge portions 55 of the framed substrates 53. The leaf spring drive mechanism 414 swings the leaf springs 421 to cause the leaf springs 421 to press the framed substrates 53 and release the pressing. Each leaf spring 421 has a crease in the vicinity of a portion where the leaf spring is fixed to the frame member 422, and generally, the other end 421a is urged in a direction of an arrow 429. The leaf spring drive mechanism 414 is provided for each of the leaf springs 421. So, the two mechanisms 414 are constructed, but since the two mechanisms 414 are the same structure, the description will be made for only one of the two. The leaf spring drive mechanism 414 includes a leaf spring swing member 423, a transmission member 424, a drive member 425 and a driving device 426. The leaf spring swing member 423 is an L-shaped member supported nearly at a central part thereof by a supporting shaft 427 mounted on the frame member 422 in a manner so that the leaf spring swing member 423 can swing. One end portion 423a of the leaf spring swing member 423 is connected in the vicinity of the other end 421a of the leaf spring 421. Therefore, the one end portion 423a and the other end portion 423b of the leaf spring swing member 423 are turned in a direction of an arrow 428 consequent to the swing of the leaf spring swing member about the supporting shaft 427, thereby the other end portion 421a of the leaf spring 421 is moved in a direction of the arrow 429. On the other hand, when the one end portion 423a and the other end portion 423b are turned in a direction of an arrow 430, the other end portion 421a of the leaf spring 421 is turned in a direction of an arrow 431 by the leaf spring swing member 423 against the urging force. The transmission member 424 can slide in a thicknesswise direction of the framed substrate 53 while being supported by the frame member 422. One end 424a of the transmission member comes into contact with the other end portion 423b of the swing member 423. The drive member 425 is a strip of plate as indicated in FIG. 11. A driving shaft 432 of the driving device 426 is coupled to one end of the drive member 425. A central part of the drive member 425 is rotatably fitted to a pin 433 erected in a base plate 438 of the component mount stage 411. The driving member 425 is accordingly rotatable about the pin 433 through the reciprocatory movement of the driving shaft 432. A member 434 shaped like a wedge in section is mounted on the driving member 425, which comes in contact with the other end 424b of the transmission member 424 and moves the transmission member 424 up and down in the thicknesswise direction in association with the rotation of the drive member 425 consequent to the reciprocation of the driving shaft 432.

Further, a positioning member is positioned at an upper face of the stage plate 412 at a rear side of the leaf spring 421 to position the framed substrates 53 on the stage plate 412 along a direction that is orthogonal to the thicknesswise direction interlockingly with the rotation of the drive member 425.

In the rotation of the drive member 425 because of the reciprocation of the driving shaft 432, when the transmission member 424 moves, e.g., in a direction of an arrow 435, the leaf spring swing member 423 turns in the direction of the arrow 430, thus moving the other end 421a of the leaf spring 421 in the arrow direction 431 to press the peripheral edge portions 55 of the framed substrates 53 placed on the stage plate 412. At this time, the above positioning member prevents the framed substrates 53 from moving in the direction orthogonal to the thicknesswise direction. Meanwhile, when the transmission member 424 moves, for instance, in a direction of an arrow 436 as a result of the rotation of the drive member 425 subsequent to the reciprocation of the driving shaft 432, the leaf spring swing member 423 rotates in the arrow direction 428 thereby moving the other end 421a of the leaf spring 421 in the arrow direction 429. And thus, the pressing by the leaf spring 421 to the framed substrates 53 is freed.

The stage drive device 440 has a motor 441 as a driving portion and a ball-screw structure including a screw rotated about an axis thereof by the motor 441 and a nut engaged with the screw. The base plate 438 of the component mount stage 411 is fitted with the nut. When the screw is rotated about the axis by the motor 441, the component mount stage 411 reciprocates in the Y direction, between a delivery position 442 and a component mount position 443, as shown in FIG. 9. The framed substrates 53 are loaded on the stage plate 412 and the SAW filters 50 are transferred from the stage plate 412 when the component mount stage 411 is present at the delivery position 442. On the other hand, when the component mount stage 411 is located at the component mount position 443, the oscillating elements 54 are mounted by the component mount head 451 in the framed substrates 53 on the stage plate 412.

The motor 441 is controlled by the control unit 601 which controls the movement of the component mount stage 411 in the Y direction.

The component mount head 451 employs suction to thereby holding the oscillating element 54 from the component reverse feed head 471 and mounts to the framed substrate 53 secured on the stage plate 412 of the component mount stage 411. The component mount head 451 has a suction nozzle 452 for holding the oscillating element 54 and an ultrasonic oscillation device 453 which is set to the suction nozzle 452 and oscillates the oscillating element 54 with ultrasonic waves to more strongly connect the oscillating element 54 with the framed substrate 53 via bumps. The suction nozzle 452 can be rotated about an axis thereof and moved up and down in an axial direction by a driving portion at a head body 454. The operation of the thus-constituted component mount head 451 is controlled by the control unit 601.

Figure 12:
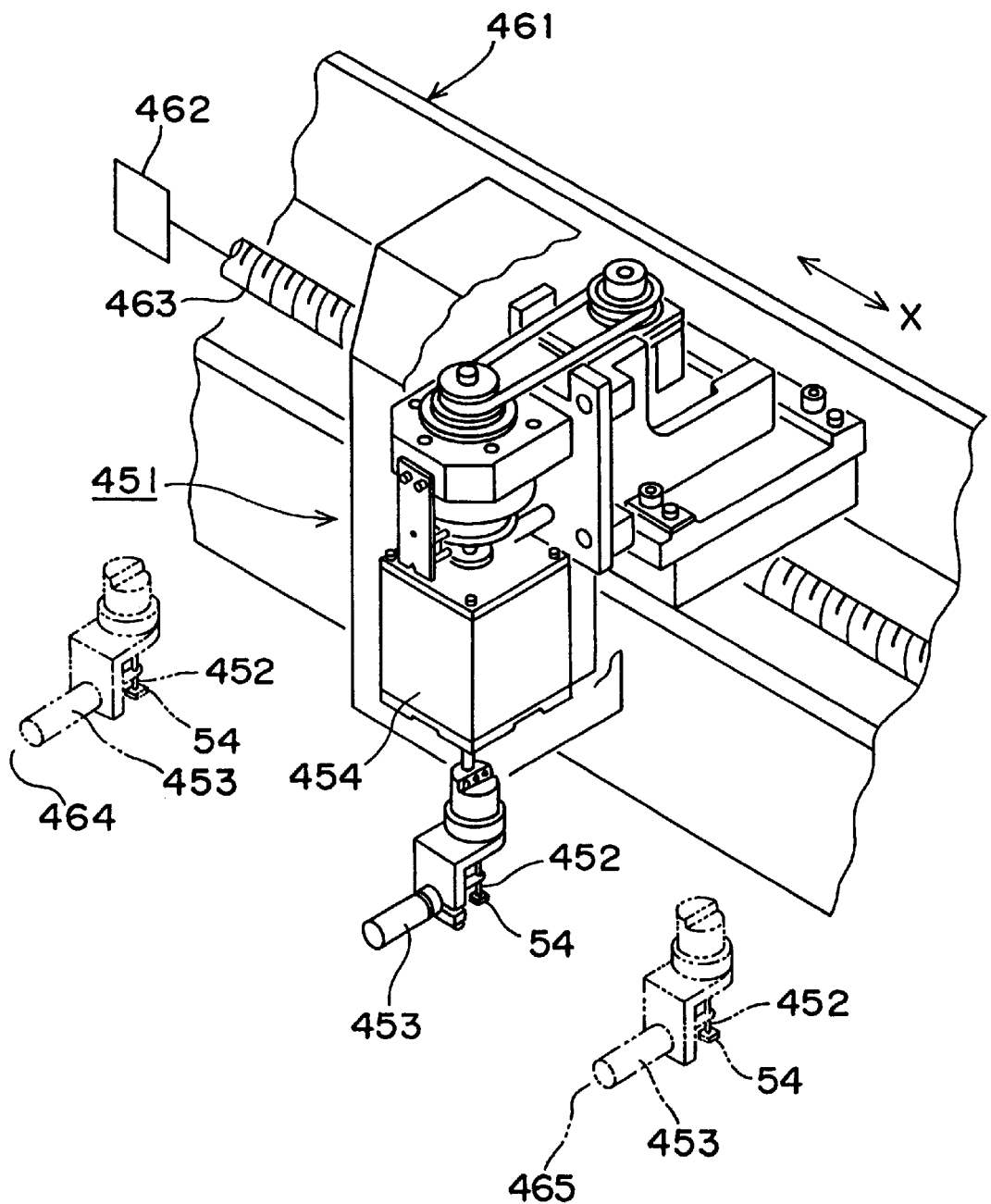
FIG. 12 is a perspective view of a mounting unit of FIG. 1.

As shown in FIG. 12, the component mount head-driving device 461 is constituted of a ball-screw structure for reciprocating the component mount head 451 in the X direction by means of a screw 463 that can rotate about an axis by a driving motor 462 between a component hold position 464 and a component mount position 465. The oscillating element 54 is held from the component reverse feed head 471 at the component hold position 464. The component mount position 465 corresponds to the component mount position 443 of the component mount stage 411. The operation of the component mount head-driving device 461 is controlled by the control unit 601.

The component reverse feed head 471 holds the oscillating element 54 as a component is supplied from the component feed unit 501 at a component feed stage portion 503, as in FIG. 1, and thereafter rotates the oscillating element 54 by 180° thereby turning the element upside down. The oscillating element 54 is held at the component hold position 464 of the component mount head 451. The operation of the component reverse feed head 471 is also controlled by the control unit 601.

In FIG. 1, the component feed unit 501 supplies the oscillating elements 54 as the components to the component mounting apparatus 101, and has a feed magazine device 502 and the component feed stage portion 503. The feed magazine device 502 stores a semiconductor wafer with a film attached and scribed beforehand to the oscillating elements 54 formed on the wafer. The semiconductor wafer is taken out from the feed magazine device 502 and the film of the semiconductor wafer is extended at the component feed stage portion 503 in the component feed unit 501.

At the time of mounting the oscillating element 54 to the framed substrate 53, the vertical visual field optical device 551 picks up images of both the oscillating element 54 held by the component mount head 451 and the framed substrate 53 loaded on the stage plate 412 of the component mount stage 411. The optical device 551, which is movable in the Y direction, is arranged above the component mount stage 411 at the component mount position 443 and below the component mount head 451 at the component mount position 465. The optical device 551 is connected to the control unit 601. The control unit 601 finely adjusts the movement of the component mount stage 411 and the component mount head 451 on the basis of information output from the optical device 551 so that the bump of the oscillating element 54 maintains a predetermined positional relationship with respect to the electrode on the framed substrate 53.

The component pickup device 571 picks up an image of the oscillating element 54 held by the component reverse feed head 471 among the oscillating elements 54 arranged at the component feed stage portion 503, and then supplies information for the control of the amount of the movement of the component reverse feed head 471 to the control unit 601. The component reverse feed head 471 is hence controlled in operation by the control unit 601.

The operation of the component mounting apparatus 101 of the above construction will be discussed below.

The storage body 211 storing the framed substrates 53 is intermittently transferred from the feed reel 221 along the arrow direction II by the operation of the transfer device 231. Immediately before the storage body 211 reaches the take-out storage position 292, the first protecting member 215, attached to the upper face 212b of the storage body 211, is detached and wound by the removal device 241. In the present embodiment, it is detected by the light-emitting detecting device 290 whether any framed substrate 53 is stored in the storage section 212 when five framed substrates 53 are arranged at the take-out storage position 292. When the framed substrate 53 is stored in every one of the five storage sections 212, the take-out and storage unit 301 executes a take-out operation and a storage operation to be described below. If the framed substrates 53 are not stored in all of the five storage sections 212, the framed substrate 53 is added to the empty storage section 212 or the take-out operation is executed in a state where the empty storage section is left as it is, or the storage body 211 is transferred until it is detected that every storage section 212 holds the framed substrate 53, and the like.

Referring to FIG. 7, in the embodiment, four holding portions 313 are denoted as 313-1 to 313-4 in the clockwise rotational direction for the convenience of explanation.

The holding portion 313-1, which has the five suction nozzles 320 and is arranged to face the take-out storage position 292 of the feed collection unit 201, sucks the framed substrates 53 from five storage sections 212 at once when the up-and-down rotary portion 312 descends to the hold and loading position and, after sucking, moves upward while the up-and-down rotary portion 312 moves to the transfer position. In accordance with the rotation by 90° of the up-and-down rotary portion 312, five framed substrates 53 sucked by the holding portion 313-1 are transferred to above the heating stage 331. The holding portion 313-4 is positioned above the take-out storage position 292 subsequent to the rotation of the up-and-down rotary portion. When the up-and-down rotary portion 312 moves to the hold and loading position, five framed substrates 53 are placed on the heating stage 331 and held because of the suction operation of the heating stage 331. Thereafter, when the up-and-down rotary portion 312 moves to the transfer position, the holding portion 313-1 moves up and stands by for a mount time described later. The five framed substrates 53 placed on the heating stage 331 are heated for the mount time.

In this embodiment, the take-out and storage unit 301 carries out operations whereby the framed substrates 53 are taken out from the storage body 211, the SAW filters 50 are stored in the storage body 211, the framed substrates 53 are heated at the heating stage 331, the oscillating elements 54 are mounted to the framed substrates 53 at the component mount stage 411 and the SAW filters 50 are cooled at the cooling stage 341. What requires the longest time among these operations is when the oscillating elements 54 are mounted to the framed substrates, and therefore a Tact time at the takeout and storage unit 301 is determined by the mount time. If a time for heating the framed substrates 53 to a predetermined preheating temperature, e.g., the above mentioned approximately 250° C. is longer than the mount time, the framed substrates 53 would be heated too high. In order to avoid this trouble, according to the embodiment, the temperature of the stage plate 333 of the heating stage 331 is controlled by the control unit 601 as described before so that each framed substrate 53 becomes approximately 250° C. immediately before being transferred to the component mount stage 411.

Once the up-and-down rotary portion 312 rotates one turn, the holding portion 313-4 is to store the held SAW filters 50 in the storage body 211. However, only the holding portion 313-1 finishes holding of the framed substrates 53 at this moment and the holding portion 313-4 has no operation to execute at the moment. The storage body 211 is sent by the transfer device 231 during the mount time to bring next five framed substrates 53 to the take-out storage position 292.

After the mount time lapses, the holding portion 313-1 sucks the five framed substrates 53 placed on the heating stage 331 subsequent to the movement of the up-and-down rotary portion 312 to the hold and loading position. At this time, the holding portion 313-4 holds the next five framed substrates 53 stored in the storage sections 212. In accordance with the movement of the up-and-down rotary portion 312 to the transfer position after the movement to the hold and loading position, the holding portion 313-1 and the other holding portions 313 move upwards. The 90° rotation of the up-and-down rotary portion 312 sends the five framed substrates 53 sucked by the holding portion 313-1 to a position above the component mount stage plate 412 located at the delivery position 442 of the component mount stage 411. The holding portion 313-4 moves to a position above the heating stage 331, while the holding portion 313-3 moves to a position above the take-out storage position 292.

In the following movement of the up-and-down rotary portion 312 to the hold and loading position, the five framed substrates 53 held by the holding portion 313-1 are loaded on the stage plate 412 and sucked by the component mount stage 411. The holding portion 313-4 places the framed substrates 53 onto the stage plate 333 of the heating stage 331.

Then, because of the movement of the up-and-down rotary portion 312 to the transfer position, the holding portion 313-1 and the other holding portions 313 move up and wait. After the suction of the framed substrates 53, the leaf spring drive device 414 of the component mount stage 411 starts operating to move the other end 421a of each leaf spring 421 in the arrow 431 direction, so that the framed substrates 53 are pressed and fixed on the stage plate 412 by the leaf springs 421. Since the stage plate 412 is heated beforehand, the framed substrates 53 are heated and kept warm. Furthermore, after the framed substrates 53 are fixed on the stage plate 412, the base plate 438 loading the stage plate 412 moves to the component mount position 443 of the component mount stage 411 in the Y direction.

Before the stage plate 412 is moved to the component mount position 443 as above, the component reverse feed head 471 holds one oscillating element 54 from the component feed stage portion 503 and turns the oscillating element 54 upside down. The suction nozzle 452 of the component mount head 451 sucks a face of the reversed oscillating element 54 to which a circuit is not formed. The component mount head 451 receives the oscillating element 54 from the component reverse feed head 471 and sends the oscillating element 54 to the component mount position 465 of the component mount head 451.

The vertical visual field optical device 551 moves in the Y direction to below the oscillating element 54 held by the suction nozzle 452 of the component mount head 451 and above the framed substrate 53, mounting the oscillating element 54, fixed to the stage plate 412 in the thicknesswise direction of the framed substrate 53 and oscillating element 54. The optical device 551 picks up images of both a circuit formation face of the oscillating element 54 and an electrode formation face of the framed substrate 53 at the same time and sends pickup information to the control unit 601. Based on the pickup information, the control unit 601 confirms a position of the framed substrate 53 among the five framed substrates 53 to which the oscillating element 54 is to be mounted, and moves at least one of the component mount heads 451 and the component mount stage 411 so that the bump at the circuit formation face of the oscillating element 54 and the electrode on the framed substrate 53 are kept in a predetermined relationship so as to correspond to each other. After the bump is registered with the electrode, the optical device 551 retreats in the Y direction, and the suction nozzle 452 of the component mount head 451 is lowered, thereby mounting the oscillating element 54 on the framed substrate 53. At the time of the mounting, the ultrasonic oscillation device 453 is activated to oscillate the oscillating element 54 with ultrasonic oscillations to achieve firm connection of the bump and the electrode. Oscillating elements 54 are sequentially mounted on all the framed substrates 53 on the stage plate 412 by repetition of the above series of operations. A mount time for one oscillating element 54 is approximately 3 seconds in the embodiment, thus it takes at least 15 seconds to mount the oscillating elements 54 to all of the five framed substrates 53. In other words, the above mentioned mount time is at least 15 seconds.

After the mounting of the oscillating elements 54 on all the framed substrates 53, the base plate 438 of the component mount stage 411 is moved in the Y direction from the component mount position 443 to the delivery position 442. The leaf spring drive mechanism 414 is started to operate after the base plate 438 is brought to the delivery position 442, and consequently the other end 421a of the leaf spring 421 is moved in the arrow direction 429 by the leaf spring swing member 423, and thereby the SAW filters 50, which are formed by mounting the oscillating elements 54 on the framed substrates 53, are freed from the fixed positions on the stage plate 412.

The holding portion 313-1 sucks five SAW filters 50 on the stage plate 412 subsequent to the movement of the up-and-down rotary portion 312 to the hold and loading position. At this time, the holding portion 313-4 takes the framed substrates 53 from the heating stage 331, while the holding portion 313-3 holds the framed substrates 53 from the storing sections 212. After sucking the SAW filters 50, the holding portion 313-1 moves upward through the movement of the up-and-down rotary portion 312 to the transfer position. The other holding portions 313 move up simultaneously with this. The five SAW filters 50, sucked by the holding portion 313-1, are arranged above the stage plate 342 of the cooling stage 341 by the rotation by 90° of the up-and-down rotary portion 312. Meanwhile, the holding portion 313-4 is located above the stage plate 412 of the component mount stage 411, the holding portion 313-3 is located above the heating stage 331 and the holding portion 313-2 is located above the take-out storage position 292 respectively.

Subsequently, as a result of the movement of the up-and-down rotary portion 312 to the hold and loading position, the five SAW filters 50 held by the holding portion 313-1 are loaded onto the stage plate 342 of the cooling stage 341, whereby the SAW filters 50 are sucked and cooled by the stage plate 342. The holding portion 313-4 places the framed substrates 53 onto the stage plate 412 of the component mount stage 411, and the holding portion 313-3 loads the framed substrates 53 onto the stage plate 333 of the heating stage 331.

Then the movement of the up-and-down rotary portion 312 to the transfer position, the holding portion 313-1 is kept waiting above the stage plate 342, and the other holding portions 313 move upward as well.

When the mount time passes, because of the movement of the up-and-down rotary portion 312 to the hold and loading position, the holding portion 313-1 sucks five SAW filters 50 on the stage plate 342 of the cooling stage 341. On the other hand, the holding portion 313-4 holds the framed substrates 53 by the stage plate 412 of the component mount stage 411, holding portion 313-3 takes the framed substrates 53 from the stage plate 333 of the heating stage 331 and the holding portion 313-2 takes the framed substrates 53 from the storing sections 212 of the storage body 211. The holding portion 313-1 and the other holding portions 313 move up after the movement of the up-and-down rotary portion 312 to the transfer position. In consequence of the rotation of the up-and-down rotary portion 312 by 90°, the five SAW filters 50 sucked by the holding portion 313-1 are sent to a position above the take-out storage position 292 again. The holding portion 313-4 is set above the stage plate 342 of the cooling stage 341 at this time, while the holding portions 313-3 and 313-2 are disposed above the stage plate 412 of the component mount stage 411 and above the heating stage 331 respectively.

By the movement of the up-and-down rotary portion 312 to the hold and loading position, the five SAW filters 50 held by the holding portion 313-1 are stored in five storing sections 212 of the storage body 211 which are emptied after the framed substrates 53 are taken outside by the holding portion 313-2.

The framed substrates 53 are taken out from the storage body 211 and the SAW filters 50 are stored in the storage body 211 by the holding portion 313 sequentially and continuously afterwards.

As described above, the storage body 211 storing the SAW filters 50 is transferred so that the framed substrates 53 are taken out therefrom by the holding portion 313. At this time, the second protecting member 216 is adhered to the upper face 212b of the storage body 211 by the set device 251 immediately after the take-out storage position 292. As the storage body 211 is further transferred, the second protecting member 216 is pressed to the upper face 212b of the storage body 211 by the pressing roller 254. The storage body 211 is transferred by the transfer device 231 in the arrow III direction and is finally wound on the collection reel 222. The storage body 211 storing the SAW filters 50 and wound on the collection reel 222 is sent to a next process together with the collection reel 222.

In the apparatus and method for mounting components according to the present embodiment as above, individual framed substrates 53, each separated beforehand, are supplied in a state while stored in the storage body 211, and then the oscillating elements 54 are mounted on the framed substrates 53, whereby the SAW filters 50 are produced. Accordingly, damage to the junction between the bump and electrode or the like inconvenience is prevented which would occur if each SAW filter is obtained by dividing a collective part of framed substrates 53 after the oscillating elements 54 are mounted thereon. Product quality is accordingly improved. The produced individual SAW filters 50 are collected again into the storage body 211 and consequently become easy to handle. The SAW filters can be sent to the next process while kept in the storage body 211.

Since a plurality of stages are set at the take-out and storage unit 301 of a rotary system, the arrangement enables concurrent operations of taking out the framed substrates 53 from the storage body 211, storing the SAW filters 50 into the storage body 211, heating the framed substrates 53 by the heating stage 331, mounting the oscillating elements 54 to the framed substrates 53 at the component mount stage 411 and cooling the SAW filters 50 at the cooling stage 341. Thus productivity is improved greatly.

Figure 13:
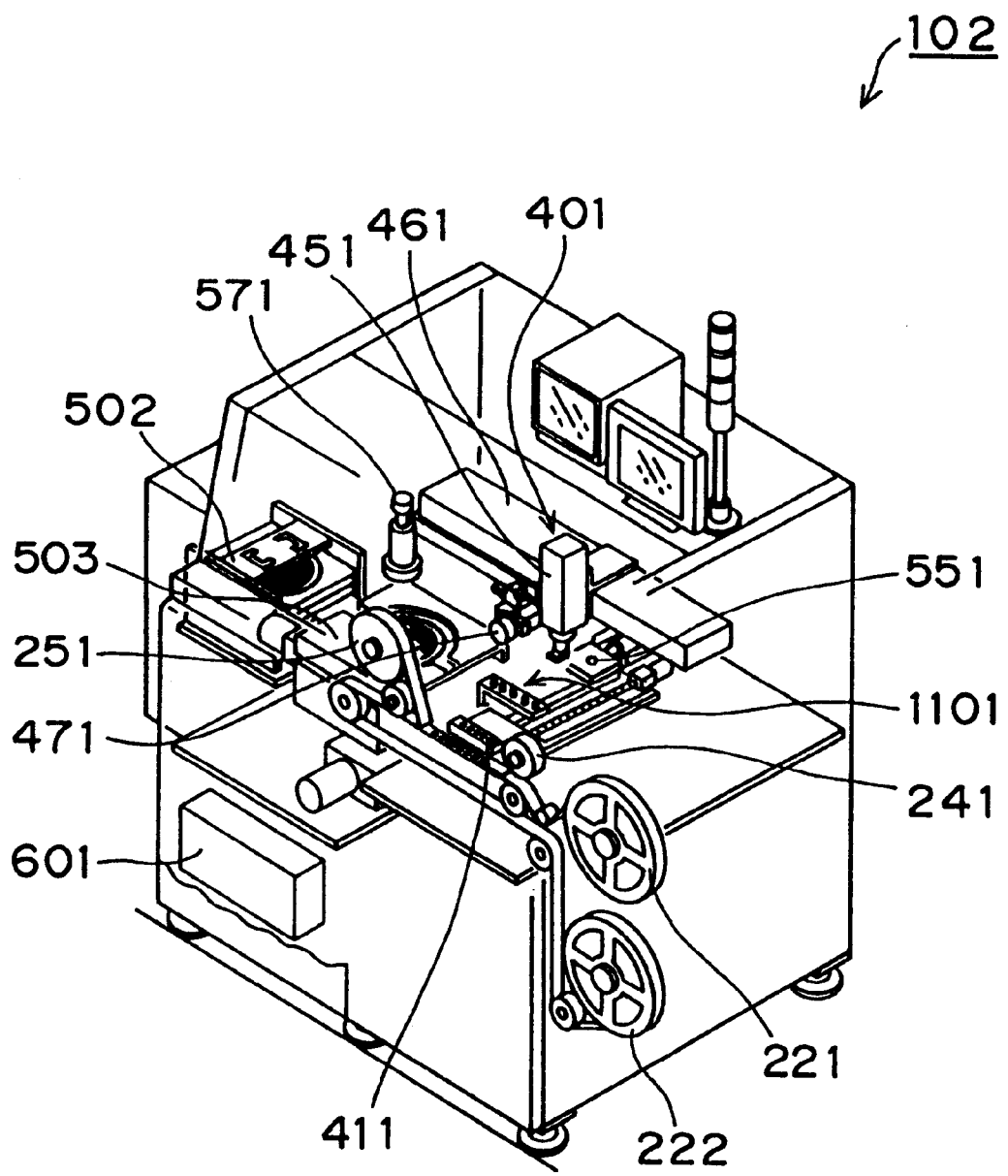
FIG. 13 is a perspective view of a modified example of the component mounting apparatus of FIG. 1.

In the component mounting apparatus 101, the takeout and storage unit 301 is not restricted to the aforementioned rotary type, for instance, a take-out and storage unit 1101 may be employed in place of the take-out and storage unit 301, as in a component mounting apparatus 102 shown in FIG. 13. The component mounting apparatus 102 is, however, constructed in the same manner, with regard to the other points, as the component mounting apparatus 101.

Figure 15:
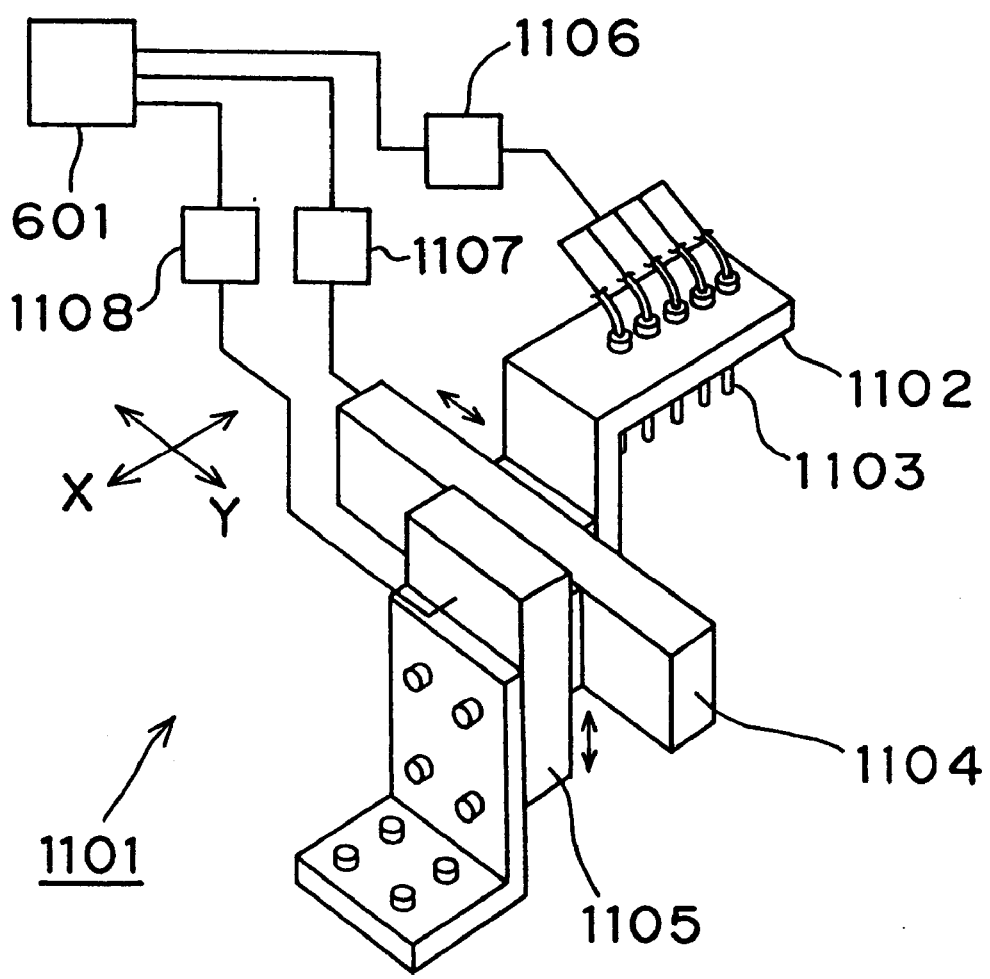
FIG. 15 is a perspective view of the take-out and storage unit of FIG. 13.

As shown in FIG. 15, the take-out and storage unit 1101 includes a holding portion 1102 having suction nozzles 1103, an air slide table 1104 for moving the holding portion 1102 set thereto in the Y direction, and an air slide table 1105 engaging with the air slide table 1104 and moving the air slide table 1104 in the thicknesswise direction of the framed substrate 53. The air slide table 1105 is fixed to a frame member of the component mounting apparatus 102. The suction nozzles 1103 are driven by a suction device 1106 to suck and stop sucking. The air slide table 1104 and air slide table 1105 are activated by driving devices 1107, 1108 respectively. These suction device 1106, driving devices 1107, 1108 are connected to the control unit 601 which controls respective operations. The operation of the component mounting apparatus 102 is equal to that of the already described component mounting apparatus 101, the description of which is therefore omitted here.

The take-out and storage unit 1101 may be provided with the heating stage 331 and cooling stage 341 described above.

Figure 14:
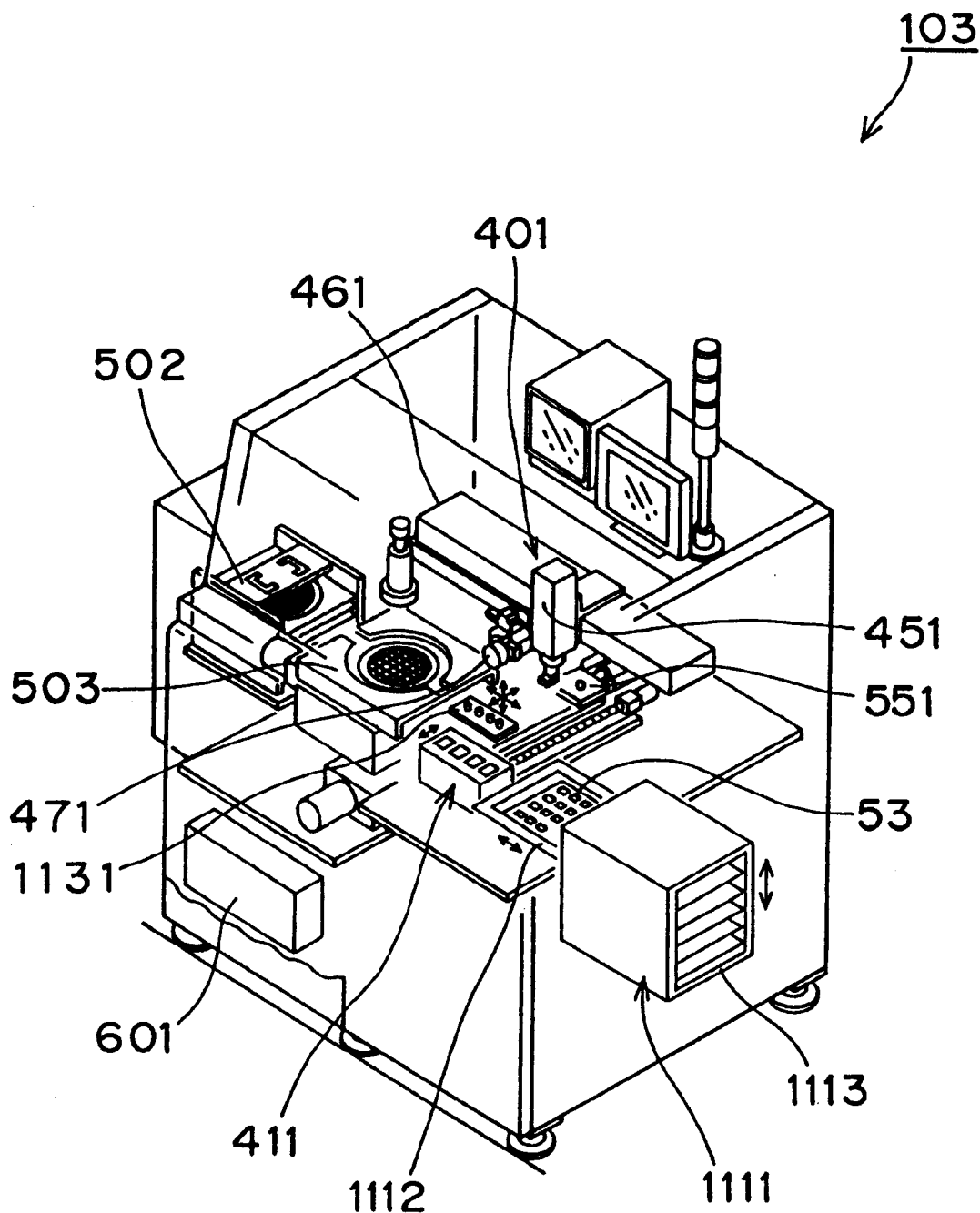
FIG. 14 is a perspective view of a further modified example of the component mounting apparatus of FIG. 1.

The feed collection unit 201 of the component mounting apparatus 101 is not limited to, the above form of the tape-type transfer. For example, a tray-type feed collection unit 1111 may be installed as in a component mounting apparatus 103 of FIG. 14, in place of the feed collection unit 201, and also a take-out and storage unit 1131 may be provided in place of the take-out and storage unit 301. The component mounting apparatus 103 is constituted in the other points in the same manner as the component mounting apparatus 101.

The feed collection unit 1111 has a tray 1112 in which the framed substrates 53 are arranged, e.g., like a lattice on a plate, and a magazine portion 1113 for feeding and storing the tray 1112. The magazine portion 1113 is connected to the control unit 601 and controlled in operation by the control unit 601.

Figure 16:
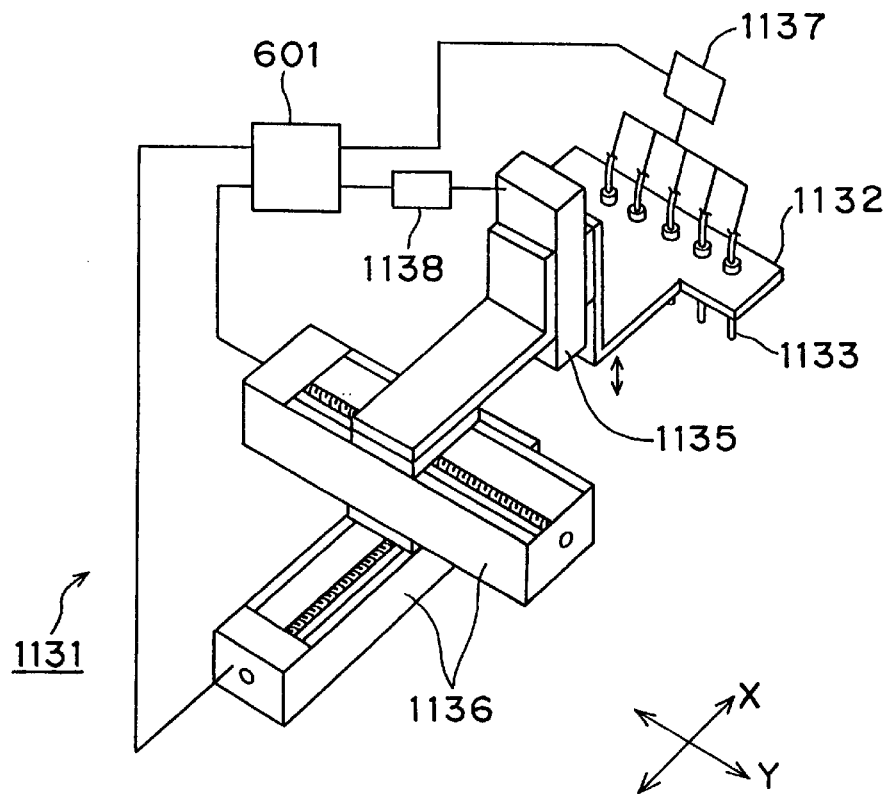
FIG. 16 is a perspective view of the take-out and storage unit of FIG. 14.

As shown in FIG. 16, the take-out and storage unit 1131 has a holding portion 1132 with suction nozzles 1133, an air slide table 1135 for attaching the holding portion 1132 and moving the holding portion 1132 in the thicknesswise direction of the framed substrates 53, and an X, Y-robot 1136 having the air slide table 1135 fitted thereto and moving the air slide table 1135 in X, Y directions. The X, Y-robot 1136 is set at a frame member of the component mounting apparatus 103. A suction device 1137 makes each suction nozzle 1133 suck and stop the suction. The air slide table 1135 is driven by a driving device 1138. The suction device 1137, driving device 1138, X, Y-robot 1136 are connected to the control unit 601 which controls respective operations.

In the component mounting apparatus 103 of the above construction, the framed substrates 53 are taken out from the tray 1112 by the take-out and storage unit 1131 and placed on the stage plate 412 of the component mount stage 411. Meanwhile, the SAW filters 50 having the oscillating elements 54 mounted thereto are caught by the take-out and storage unit 1131 at the stage plate 412 of the component mount stage 411 and stored again into the tray 1112.

The heating stage 331 and cooling stage 341 may be added to the take-out and storage unit 1131.

Figure 17:
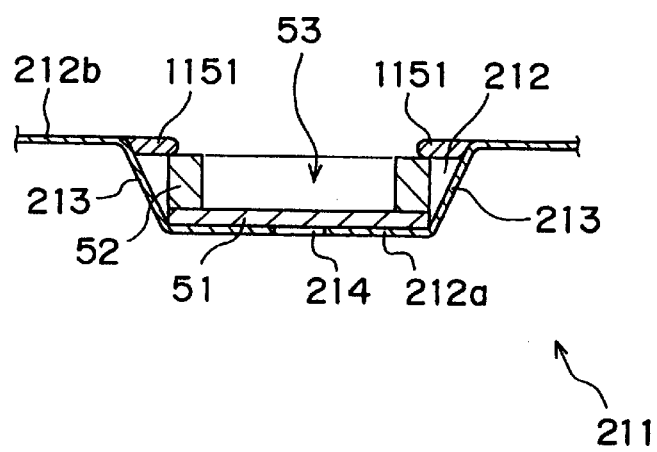
FIG. 17 is a sectional view of a modified example of the storage body of FIG. 6.
Figure 18:
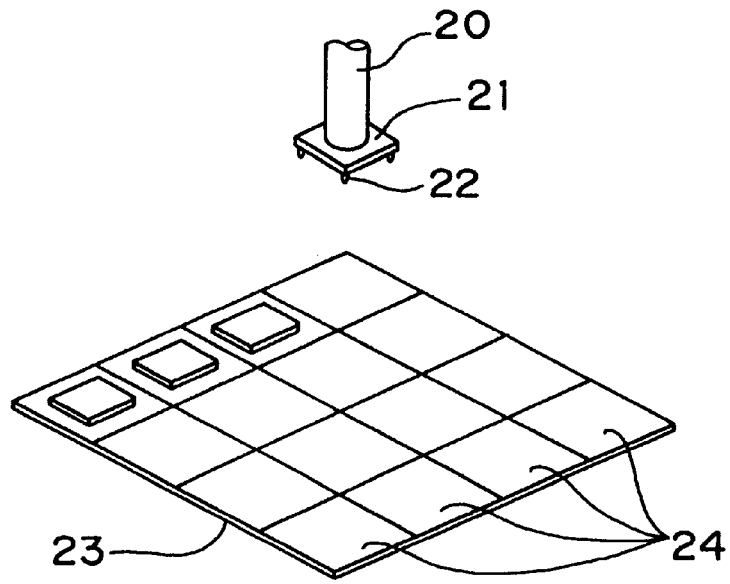
FIG. 18 is a perspective view of a conventional method for mounting components on a circuit board before being divided into individual components.
Figure 19:
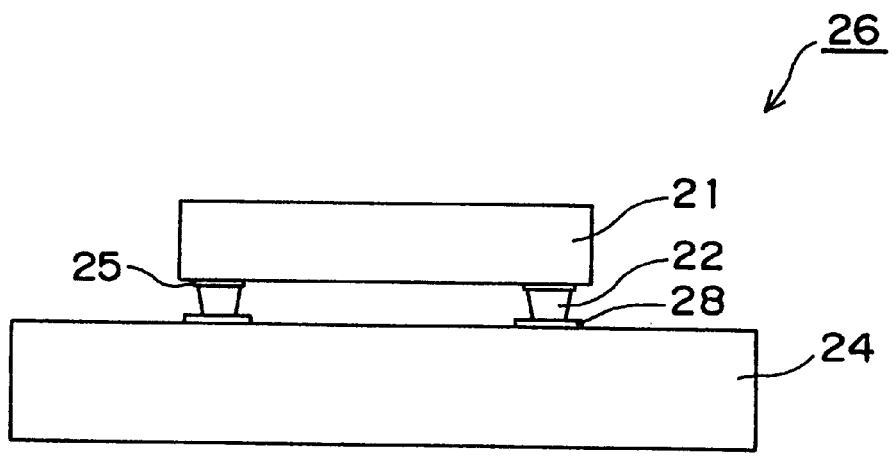
FIG. 19 is a side view showing a mount state of the circuit board and the component.

As described above, the feed collection unit 201 of the component mounting apparatus 101 has the protecting member removal device 241 and the protecting member set device 251. Although it is preferred to attach the first protecting member 215 and second protecting member 216 to the storage body 211 to prevent dust, etc. for the framed substrates 53 stored in the storing sections 212, the protecting member removal device 241 and protecting member set device 251 are not essential. That is, as indicated in FIG. 17, a projecting member 1151 of a flexible material may be set at an opening part of the storing section 212 of the storage body 211 to prevent the framed substrate 53 in the storing section 212 from rattling or from slipping out of the storing section 212. The projecting member 1151 keeps in contact with the frame body 52 of the framed substrate 53 and is flexible, and therefore never hinders the framed substrate 53 from being taken out from the storing section 212 and stored in the storing section 212. The projecting member 1151 can be formed so as to trace the whole periphery of the frame body 52 or to correspond to two opposite sides of the frame body 52.

The projecting member 1151 is not limited in shape to the thin element as in FIG. 17 and can be formed in any shape so long as it can hold the divided components stored in the storing section 212 and facilitate the take-out and storage of the component to the storing section 212.

In the component mounting apparatuses 101-103, the ultrasonic oscillation device 453 may be eliminated at the component mount head 451. Without the ultrasonic oscillation device 453, the framed substrates 53 can be connected to the oscillating elements 54 with the use of, e.g., a thermosetting resin or by ACF junction, etc.

In the foregoing description, the component corresponding to the oscillating element 54 is a flat semiconductor chip. However, the component may be a spherical semiconductor element, and in this case a leading end portion of the suction nozzle sucking the spherical semiconductor element is formed, for example, spherical to conform to the spherical semiconductor element.

Although the present invention has been fully described in connection with the preferred embodiment thereof with reference to the accompanying drawings, it is to be noted that various changes and modifications are apparent to those skilled in the art. Such changes and modifications are to be understood as included within the scope of the present invention as defined by the appended claims unless they depart therefrom.

What is claimed is:

1. A component mounting apparatus comprising:
   a storage body for storing a divided component separated from a collective part;
   a take-out and storage unit which takes out the divided component from the storage body, brings back the divided component with component mounted thereto into the storage body, further transfers the divided component from the storage body to a component mount stage where the component is mounted to the divided component and transfers the divided component with the component mounted thereto from the component mount stage to the storage body;
   a mounting unit which mounts the component to the divided component taken out by the take-out and storage unit thereby forming the divided component with the component mounted thereto; and
   a control unit which controls operations of the take-out and storage unit and the mounting unit.

2. The component mounting apparatus according to claim 1, wherein the mounting unit has a pressing device which presses opposite peripheral edge portions of the divided component thereby securing the divided component to a stage plate of the component mount stage when the component is mounted to the divided component.

3. The component mounting apparatus according to claim 2, wherein the pressing device has a pair of leaf springs for pressing the peripheral edge portions of the divided component, and a leaf spring drive mechanism for driving the leaf springs to press and release the press to the peripheral edge portions.

4. The component mounting apparatus according to claim 1, wherein the mounting unit has an ultrasonic oscillation device for oscillating the component when the component is mounted to the divided component.

5. The component mounting apparatus according to claim 1, wherein the take-out and storage unit includes a heating stage for preheating the divided component to mount the component to the divided component by the mounting unit, a cooling stage for preliminarily cooling the divided component with the component mounted thereto to a temperature whereby a thermal damage to the storage body by the divided component with the component mounted thereto when the divided component with the component mounted thereto is stored in the storage body is prevented, and a holding transfer device which carries out operations of taking out the divided component from the storage body, bringing back the divided component with the component mounted thereto into the storage body, transferring the divided component among the storage body, heating stage and component mount stage, and transferring the divided component with the component mounted thereto among the component mount stage, cooling stage and the storage body.

6. The component mounting apparatus according to claim 5, wherein the holding transfer device moves in a thicknesswise direction of the divided component and the divided component with the component mounted thereto to hold the divided component and the divided component with the component mounted thereto and rotates about a rotary shaft extending in parallel to the thicknesswise direction to transfer the divided component and the divided component with the component mounted thereto.

7. The component mounting apparatus according to claim 5, wherein the heating stage is controlled in temperature by the control unit so as to heat the component to a temperature required for mounting of the component within a time required for mounting the component by the mounting unit.

8. The component mounting apparatus according to claim 1, wherein the divided component is a circuit board to which an oscillating element constituting an oscillating device is to be mounted, and the divided component with the component mounted thereto is the oscillating device having the oscillating element flip-chip bonded to the circuit board.

9. The component mounting apparatus according to claim 8, wherein the oscillating device is a SAW filter.

10. The component mounting apparatus according to claim 1, wherein the storage body includes a first protecting member covering the divided component, the component mounting apparatus further comprising a second protecting member for covering the divided component with the component mounted thereto after the divided component with the component mounted thereto is stored in the storage body.

11. The component mounting apparatus according to claim 10, further including:

a protecting member removal device for removing the first protecting member from the storage body before the divided component is taken out of the storage body;

a protecting member setting device for fitting the second protecting member on the storage body after the divided component with the component mounted thereto is stored in the storage body.

12. The component mounting apparatus according to claim 11, further comprising a transmission mechanism disposed between the protecting member removal device and the transfer device, the transmission mechanism being operable to transmit the operation of the transfer device to the protecting member removal device so that the first protecting member can be removed from the storage body in synchronization with a transfer operation of the transfer device.

13. The component mounting apparatus according to claim 1, wherein the storage body comprises a tape adapted to accommodate a plurality of divided components.

14. The component mounting apparatus according to claim 13, further comprising:

a feed reel on which the tape is wound;

a collection reel for taking up the tape from the feed reel; and a transfer device for transferring the tape from the feed reel to the collection reel.

* * * * *